US009714960B2

(12) United States Patent
Vandermey

(10) Patent No.: US 9,714,960 B2
(45) Date of Patent: Jul. 25, 2017

(54) APPARATUS FOR MEASURING RF VOLTAGE FROM A QUADRUPOLE IN A MASS SPECTROMETER

(75) Inventor: John Vandermey, Georgetown (CA)

(73) Assignee: DH Technologies Development Pte. Ltd., Singapore (SG)

( * ) Notice: Subject to any disclaimer, the term of this patent is extended or adjusted under 35 U.S.C. 154(b) by 313 days.

(21) Appl. No.: 12/899,672

(22) Filed: Oct. 7, 2010

(65) Prior Publication Data

US 2011/0084690 A1   Apr. 14, 2011

(51) Int. Cl.

| G01R 19/22 | (2006.01) |
|---|---|
| G01R 19/00 | (2006.01) |
| H01J 49/02 | (2006.01) |
| G01R 33/32 | (2006.01) |
| G01R 33/36 | (2006.01) |
| G01R 21/10 | (2006.01) |

(52) U.S. Cl.
CPC ........ G01R 19/003 (2013.01); G01R 19/0084 (2013.01); H01J 49/022 (2013.01); G01R 21/10 (2013.01); G01R 33/32 (2013.01); G01R 33/36 (2013.01)

(58) Field of Classification Search
CPC ...................................................... G01R 31/42
USPC ..... 324/72, 72.5, 76.11, 119, 149, 316, 318, 324/321, 322
See application file for complete search history.

(56) References Cited

U.S. PATENT DOCUMENTS

| 3,221,272 | A | * | 11/1965 | Aoki | ........................ H03C 1/14 |
| | | | | | 332/175 |
| 3,582,675 | A | * | 6/1971 | Jordan, Jr. | ........... G06G 7/1865 |
| | | | | | 327/345 |
| 3,815,011 | A | * | 6/1974 | Milkovic | ....................... 323/357 |
| 3,822,408 | A | * | 7/1974 | Veranth | .......................... 330/99 |
| RE28,851 | E | * | 6/1976 | Milkovic | ....................... 323/357 |
| 4,214,158 | A | | 7/1980 | Schmidt | |
| 4,221,964 | A | | 9/1980 | Schlereth et al. | |
| 4,429,218 | A | * | 1/1984 | Thomas | .................... 250/214 R |
| 4,502,013 | A | * | 2/1985 | Usui | .............................. 327/104 |
| 4,564,814 | A | * | 1/1986 | Miura et al. | ................... 327/104 |
| 4,703,190 | A | | 10/1987 | Tamura et al. | |
| 4,816,675 | A | * | 3/1989 | Fies et al. | ...................... 250/282 |
| 4,841,227 | A | * | 6/1989 | Maier | ................... G01F 23/266 |
| | | | | | 324/608 |

(Continued)

OTHER PUBLICATIONS

Chaniotakis, Lectures Notes: Op Amp, MIT-Open-Courseware, 6.071J, p. 7-8, Spring 2006.*

(Continued)

*Primary Examiner* — Giovanni Astacio-Oquendo

(57) ABSTRACT

An apparatus for measuring RF voltage from a quadrupole in a mass spectrometer are provided. The apparatus comprises at least one rectifying diode circuit for rectifying the RF voltage of the quadrupole to produce a rectified RF voltage. The apparatus further comprises at least one operational amplifier configured as a current to voltage converter, a negative input of the at least one operational amplifier connected to the output of at least one diode in the at least one rectifying diode circuit, a positive input of the at least one operational amplifier at ground, and an output of the at least one operational amplifier in a feedback loop with the negative input, to reduce reverse leakage current from the at least one diode.

14 Claims, 9 Drawing Sheets

(56) References Cited

U.S. PATENT DOCUMENTS

| | | | | |
|---|---|---|---|---|
| 5,030,925 | A * | 7/1991 | Taylor | 330/308 |
| 5,043,559 | A * | 8/1991 | Scott | H05B 3/746 |
| | | | | 219/448.11 |
| 5,067,045 | A * | 11/1991 | Schweiger | 361/56 |
| 5,099,191 | A * | 3/1992 | Galler et al. | 323/313 |
| 5,252,928 | A * | 10/1993 | Giorgetta | 330/51 |
| 5,349,304 | A * | 9/1994 | Ryat | 330/253 |
| 5,354,988 | A * | 10/1994 | Jullien | 250/292 |
| 5,734,163 | A | 3/1998 | Hayashi et al. | |
| 5,955,734 | A * | 9/1999 | Michon et al. | 250/372 |
| 6,480,007 | B1 * | 11/2002 | Beck et al. | 324/662 |
| 6,597,228 | B1 * | 7/2003 | Reichel | 327/330 |
| 6,686,729 | B1 * | 2/2004 | Kawamura et al. | 323/282 |
| 6,914,435 | B2 * | 7/2005 | Graham | G01R 23/20 |
| | | | | 324/500 |
| 7,161,142 | B1 * | 1/2007 | Patterson et al. | 250/282 |
| 7,560,982 | B2 * | 7/2009 | Graham | H03H 11/12 |
| | | | | 327/557 |
| 7,749,447 | B1 * | 7/2010 | Sauter, Jr. | B01L 3/0268 |
| | | | | 210/656 |
| 7,825,735 | B1 * | 11/2010 | Wessendorf | 330/308 |
| 2003/0090326 | A1 * | 5/2003 | Pogrebinsky et al. | 330/308 |
| 2007/0096080 | A1 * | 5/2007 | Cain et al. | 257/40 |
| 2007/0250139 | A1 * | 10/2007 | Kanzius | A61N 1/406 |
| | | | | 607/100 |
| 2008/0048112 | A1 * | 2/2008 | Makarov et al. | 250/290 |
| 2010/0321232 | A1 * | 12/2010 | Lewis | G01S 13/62 |
| | | | | 342/160 |
| 2013/0015343 | A1 * | 1/2013 | Steiner | H01J 49/022 |
| | | | | 250/282 |
| 2014/0132246 | A1 * | 5/2014 | Schwind | G01R 25/00 |
| | | | | 324/76.82 |
| 2015/0084509 | A1 * | 3/2015 | Yuzurihara | H01J 37/32082 |
| | | | | 315/111.21 |
| 2016/0056770 | A1 * | 2/2016 | Delepaut | H02M 3/158 |
| | | | | 330/297 |

OTHER PUBLICATIONS

PCT Application No. PCT/CA2010/001605 International Search Report mailed Jan. 13, 2011.

PCT Application No. PCT/CA2010/001605 Written Opinion mailed Jan. 13, 2011.

* cited by examiner

APPARATUS FOR MEASURING RF VOLTAGE FROM A QUADRUPOLE IN A MASS SPECTROMETER

CROSS-REFERENCE TO RELATED APPLICATIONS

The present application claims priority from U.S. Patent Application No. 61/250,142 filed Oct. 9, 2009, entitled "Apparatus For Measuring Rf Voltage From A Quadrupole In A Mass Spectrometer", and incorporated herein by reference.

FIELD

The specification relates generally to mass spectrometers, and specifically to an apparatus for measuring RF voltage from a quadrupole in a mass spectrometer.

BACKGROUND

Precise control of RF voltage applied to a quadrupole in mass spectrometer is generally desirable as the applied RF voltage generally contributes to the ejection and/or filtering of ions in the quadrupole. Hence, the precision to which RF voltage is applied affects the accuracy and reliability of the quadrupole. In order to control the RF voltage, the RF voltage is generally measured via an RF detector and an RF power source controlled in a feedback loop with the RF detector. FIG. 2 depicts an RF detector according to the prior art in which a rectifying diode array is used to measure RF voltage in combination with an averaging circuit, such as an RC filter, for providing an average of the rectified RF voltage. However, such an RF detector suffers from reverse leakage current in the diodes, which in turn leads to instability in the detector resulting in mass drift in the quadrupole and breakdown of the diodes.

SUMMARY

A first aspect of the specification provides an apparatus for measuring RF voltage from a quadrupole in a mass spectrometer. The apparatus comprises at least one rectifying diode circuit for rectifying the RF voltage of the quadrupole to produce a rectified RF voltage. The apparatus further comprises at least one operational amplifier configured as a current to voltage converter, a negative input of the at least one operational amplifier connected to the output of at least one diode in the at least one rectifying diode circuit, a positive input of the at least one operational amplifier at ground, and an output of the at least one operational amplifier in a feedback loop with the negative input, to reduce reverse leakage current from the at least one diode.

The apparatus can further comprise at least one capacitor, of a given capacitance, for isolating the quadrupole from the at least one rectifying diode circuit such that the RF voltage is reduced by a given amount.

The apparatus can further comprise an RC filter, following the at least one operational amplifier, for providing an average of the rectified RF voltage.

The at least one rectifying diode circuit can be enabled to rectify RF voltage of one RF power supply, the RF power supply for supplying RF voltage to the quadrupole.

The at least one rectifying diode circuit can be enabled to rectify RF voltage of at least two RF power supplies, the RF power supplies for supplying RF voltage to at least one quadrupole, including the quadrupole.

The apparatus can further comprise at least one connector for connection to at least one of: the quadrupole; and at least one RF power supply for supplying the RF voltage to the quadrupole.

The apparatus can further comprise at least one connector for connection to a feedback loop for controlling an RF power supply for supplying the RF voltage to the quadrupole, the at least one connector in communication with an output of the operational amplifier such that a measured rectified RF voltage can be determined.

A second aspect of the specification provides a method for measuring RF voltage from a quadrupole in a mass spectrometer. The method comprises providing a circuit comprising: at least one rectifying diode circuit for rectifying the RF voltage of the quadrupole to produce a rectified RF voltage; and at least one operational amplifier configured as a current to voltage converter, a negative input of the at least one operational amplifier connected to the output of at least one diode in the at least one rectifying diode circuit, a positive input of the at least one operational amplifier at ground, and an output of the at least one operational amplifier in a feedback loop with the negative input, to reduce reverse leakage current from the at least one diode; and measuring the RF voltage via the circuit.

The circuit can further comprise at least one capacitor, of a given capacitance, for isolating the quadrupole from the at least one rectifying diode circuit such that the RF voltage is reduced by a given amount.

The circuit can further comprise an RC filter, following the at least one operational amplifier, for providing an average of the rectified RF voltage.

The at least one rectifying diode circuit can be enabled to rectify RF voltage of one RF power supply, the RF power supply for supplying RF voltage to the quadrupole.

The at least one rectifying diode circuit can be enabled to rectify RF voltage of at least two RF power supplies, the RF power supplies for supplying RF voltage to at least one quadrupole, including the quadrupole.

The circuit can further comprise at least one connector for connection to at least one of: the quadrupole; and at least one RF power supply for supplying the RF voltage to the quadrupole.

The circuit can further comprise at least one connector for connection the circuit to a feedback loop for controlling an RF power supply for supplying the RF voltage to the quadrupole, the at least one connector in communication with an output of the operational amplifier such that a measured rectified RF voltage can be determined.

BRIEF DESCRIPTIONS OF THE DRAWINGS

Embodiments are described with reference to the following figures, in which.

DETAILED DESCRIPTION OF THE EMBODIMENTS

Figure 1:
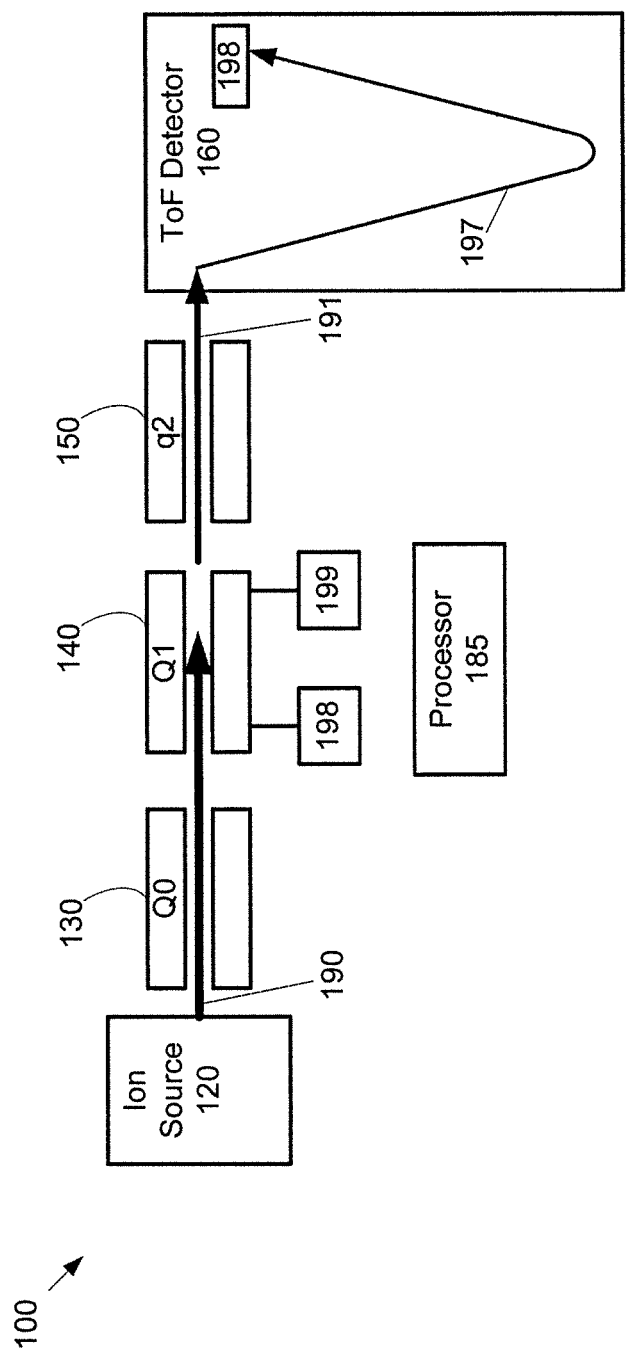
FIG. 1 depicts a block diagram of a mass spectrometer, according to non-limiting embodiments.

FIG. 1 depicts a mass spectrometer 100, mass spectrometer 100 comprising an ion guide 130, a quadrupole 140, a collision cell 150 (e.g. a fragmentation module) and a time of flight (ToF) detector 160, mass spectrometer 100 enabled to transmit an ion beam from ion source 120 through to ToF detector 160. In some embodiments, mass spectrometer 100 can further comprise a processor 185 for controlling operation of mass spectrometer 100, including but not limited to controlling ion source 120 to ionise the ionisable materials, controlling RF power supplied to quadrupole 140, and controlling transfer of ions between modules of mass spectrometer 100. In operation, ionisable materials are introduced into ion source 120. Ion source 120 generally ionises the ionisable materials to produce ions 190, in the form of an ion beam, which are transferred to ion guide 130 (also identified as Q0, indicative that ion guide 130 take no part in the mass analysis). Ions 190 are transferred from ion guide 130 to quadrupole 140 (also identified as Q1), which can operate as a mass filter, and which can be controlled to filter and eject ions 191, as described below. Ejected ions 191 can then be transferred to collision cell 150 (also identified as q2) for fragmentation and then to ToF detector 160 for production of mass spectra. In doing so, ions 191 follow a path 197 through ToF detector 160 and impinge on a suitable detector surface 198, the time of flight it takes to travel path 197 being proportional to the square root of the mass to charge ratio of an ion. In some embodiments, collision cell 150 comprises a quadrupole, similar to quadrupole 140, which can be controlled to filter and eject ions 191.

Furthermore, while not depicted, mass spectrometer 100 can comprise any suitable number of vacuum pumps to provide a suitable vacuum in ion source 120, ion guide 130, quadrupole mass filter 140, collision cell 150 and/or ToF detector 160. It is understood that in some embodiments a vacuum differential can be created between certain elements of mass spectrometer 100: for example a vacuum differential is generally applied between ion source 120 and ion guide 130, such that ion source 120 is at atmospheric pressure and ion guide 130 is under vacuum. While also not depicted, mass spectrometer 100 can further comprise any suitable number of connectors, power sources, RF (radio-frequency) power sources, DC (direct current) power sources, gas sources (e.g. for ion source 120 and/or collision cell 150), and any other suitable components for enabling operation of mass spectrometer 100.

Mass spectrometer 100 further comprises an apparatus 198 for measuring RF voltage supplied to a quadrupole in mass spectrometer 100, apparatus 198 generally comprising an RF detector, as will be described below. Mass spectrometer 100 further comprises an apparatus 199 for providing RF voltage and RF power to a quadrupole in mass spectrometer 100, for example at least one of quadrupole 140 and collision cell 150. Apparatus 199 enables at least one of quadrupole 140 and collision cell 150 to be controlled to filter and eject ions 191 and generally comprises an RF power supply. In general, apparatus 198 is in a feedback loop with apparatus 199 such that RF voltage is supplied to a quadrupole via apparatus 199, the RF voltage measured via apparatus 198, and the RF voltage adjusted based on the measurement. The feedback loop can be controlled via processor 185. Furthermore, it is understood that apparatus 198 can be connected to quadrupole 140 (and/or collision cell 150) and/or apparatus 199 such that RF voltage supplied to quadrupole 140 (and/or collision cell 150) is measurable by apparatus 198.

In some embodiments, apparatus 199 can comprise a plurality of RF power supplies, each for supplying RF voltage to at least one quadrupole. In some embodiments apparatus 199 comprises at least two power supplies for each quadrupole in mass spectrometer 100, one for each pair of rods in a given quadrupole.

Figure 2:
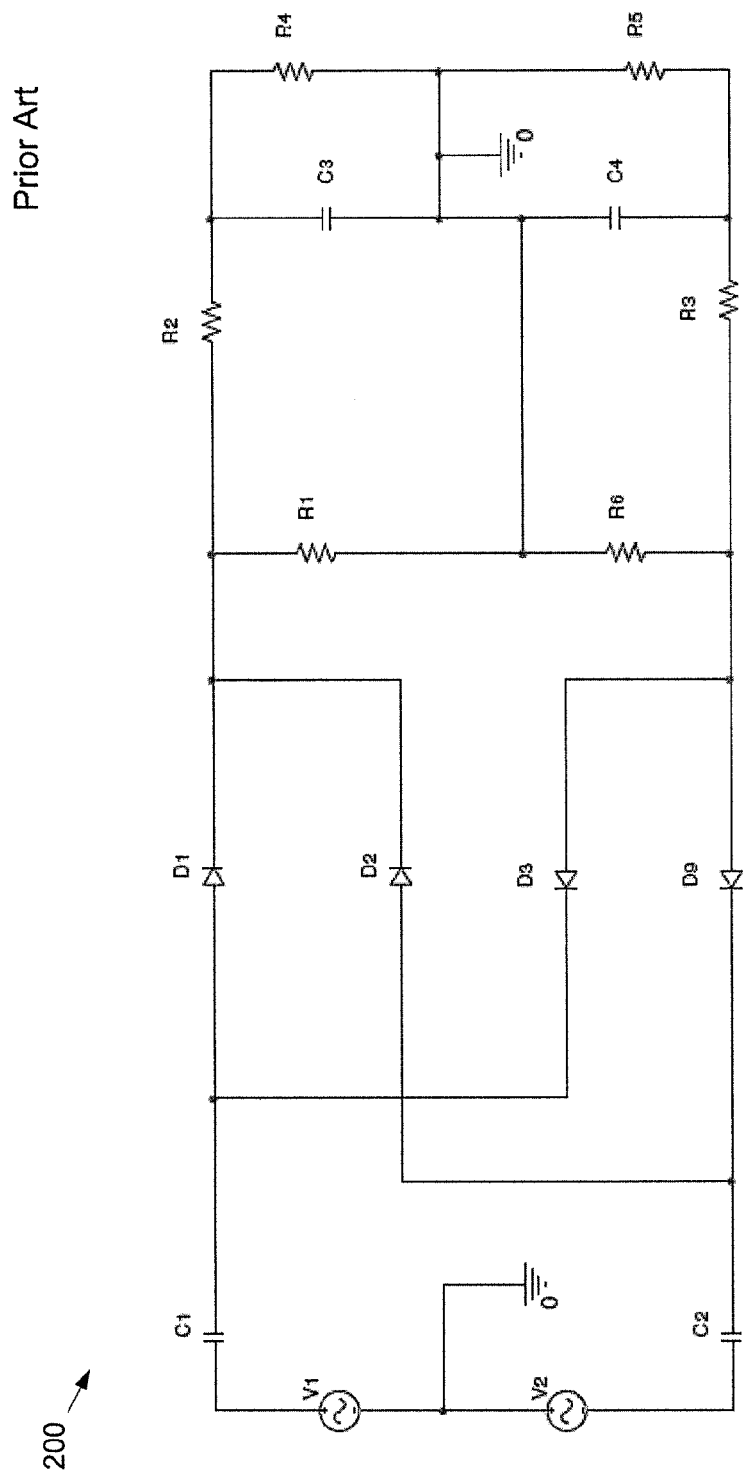
FIGS. 2, 4 and 5 depict schematic diagrams of circuits for measuring RF voltage supplied to a quadrupole in a mass spectrometer, according to the prior art.

In the prior art, RF detectors comprise a circuit similar to that of circuit 200 depicted in FIG. 2, in which RF power supplies V1 and V2 each represent RF power supplies (for example in apparatus 199) for supplying RF voltage to a quadrupole. For example, V1 can supply RF voltage to a first pair of rods in a quadrupole and V2 can supply RF voltage to a second pair of rods in the quadrupole. Diodes D1, D2, D3 and D9 form a rectifying diode circuit for rectifying the RF voltage supplied to a quadrupole to produce a rectified RF voltage. Capacitors C1 and C2 server isolate a quadrupole from the rectifying diode circuit such that said the voltage is reduced by a given amount based on the capacitance of each of capacitors C1 and C2. Resistor R2 and capacitor C3 form an averaging circuit (e.g. an RC filter), enabled to receive the forward rectified RF voltage from the rectifying diode circuit, such that an average of the forward rectified RF voltage can be measured across resistor R4. Similarly, resistor R3 and capacitor C4 form an averaging circuit, enabled to receive the reverse rectified RF voltage from the rectifying diode circuit, such that an average of the reverse rectified RF voltage can be measured across resistor R5. R1 and R6 are enabled to convert current to voltage.

The values of capacitors C1, C2, C3, C4, and resistors R1, R2, R3, R4, R5, R6 can be any suitable value and can be determined via any suitable circuit modelling software. Furthermore, the values of capacitors C1, C2, C3, C4, and resistors R1, R2, R3, R4, R5, R6 can depend on the desired gain of circuit 200 and or/the degree of averaging desired. In specific non-limiting embodiments, capacitors C1, C2 are each on the order of a few pF, capacitors C3, C4 are each on the order of a few nF, resistors R1, R6 are each on the order of a few hundred ohms, resistors R2, R3 are each on the order of a kilo-ohm to tens of kilo-ohms, and resistors R4, R5 are each on the order of a few megaohms. Each of diodes D1, D2, D3, D9 can comprise any suitable diode. In specific non-limiting exemplary embodiments, each of diodes D1, D2, D3, D9 can comprise a Schottky diode D1N5711, however any suitable diode is within the scope of present embodiments.

Figure 3:
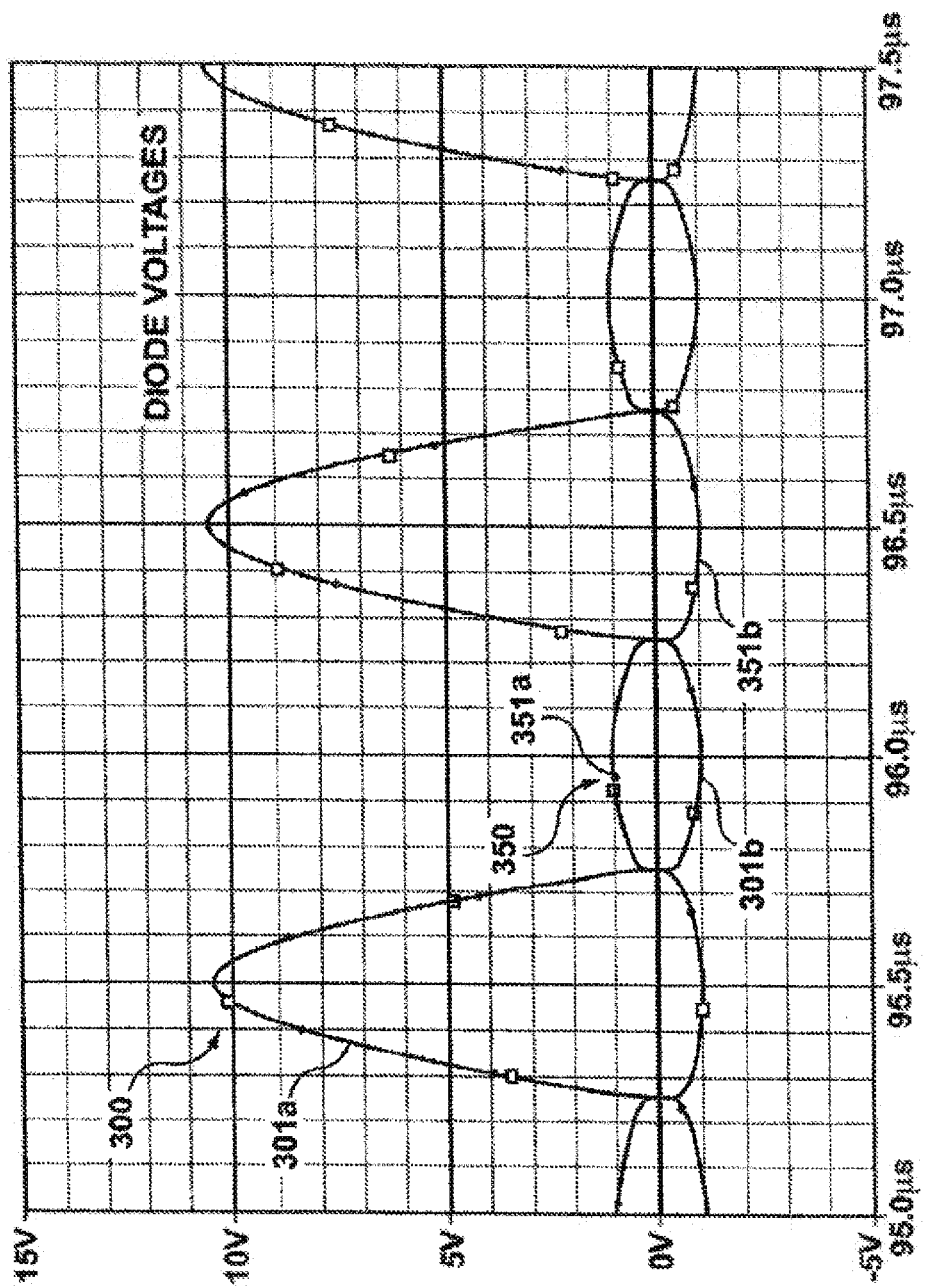
FIG. 3 depicts voltage drops across diodes in circuits for measuring RF voltage supplied to a quadrupole in a mass spectrometer for the prior art and according to non-limiting embodiments.

Attention is now directed to FIG. 3, which depicts a curve 300 representing a modelled voltage drop across diode D1, for example, when an RF voltage is applied to the diode D1. Curve 300 comprises a plurality of positive sections, represented in part by section 301a, and a plurality of negative sections, represented in part by section 301b, alternating there between as an RF voltage is applied. In general, section 301a represents the reverse bias voltage drop across diode D1, for example, and section 301b represents the forward bias voltage drop across diode D1. It is understood from section 301b that the reverse bias voltage drop can be much higher than the forward bias voltage drop (for example greater than 10V compared to about 1 V as depicted), as with a reverse bias voltage applied a diode generally acts like a large resistor. Hence, reverse leakage current from the diode tends to be quite large. It is this large reverse bias voltage drop and reverse leakage current which causes problems in diodes, contributing to the measured average rectified voltage across resistor R4 (or resistor R5), as well as to instability in the diodes and thus circuit 200 overall, which in turn results in mass drift in the quadrupole to which the RF voltage is being supplied and eventually breakdown of the diodes. Mass drift occurs as the diodes become unstable and the measured average rectified RF voltage begins to differ from the actual average rectified RF voltage.

FIG. 3 further depicts a curve 350 and sections 351a, 351b, described below.

Figure 4:
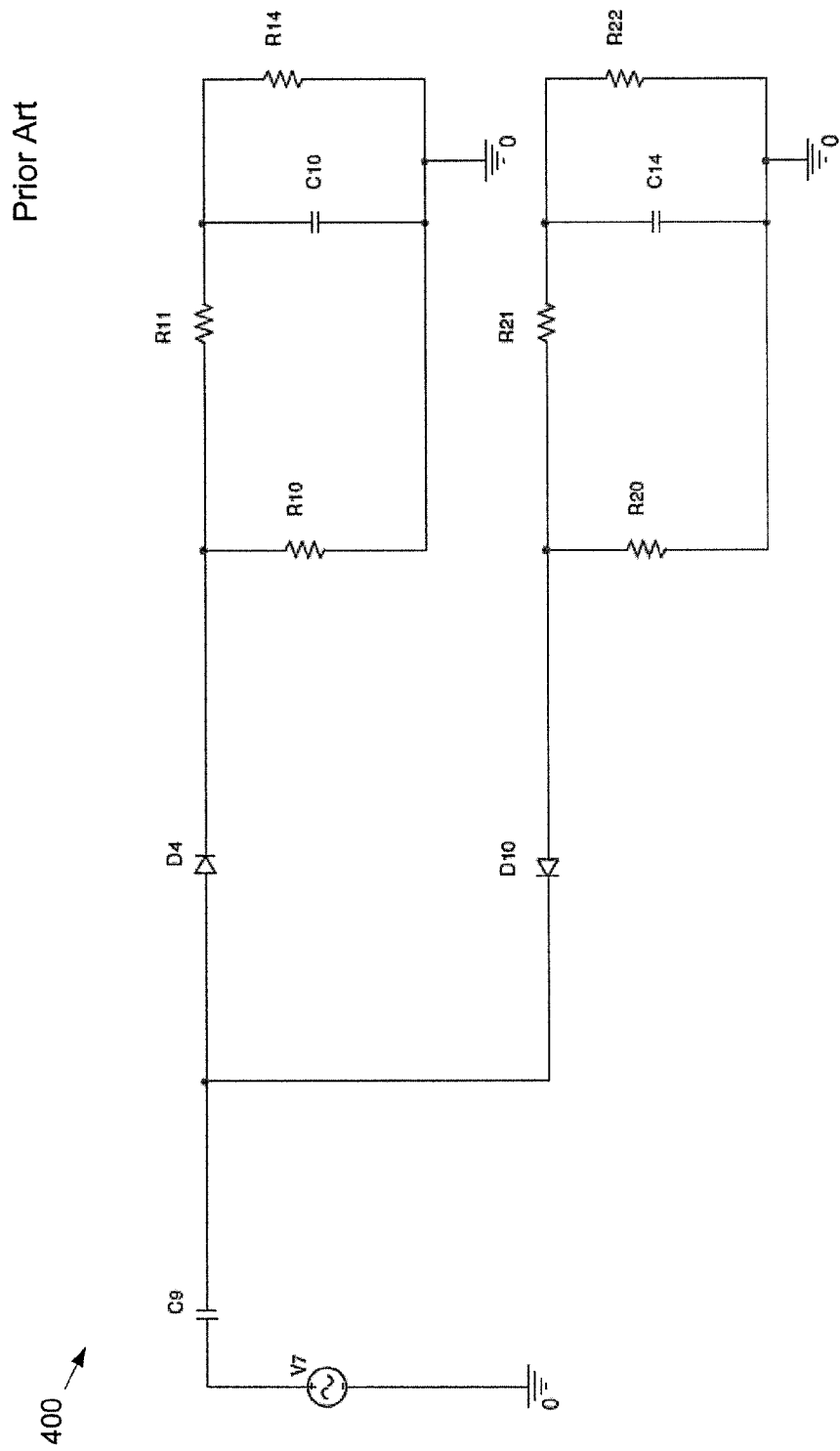

Attention is now directed to FIG. 4 which depicts a circuit 400 which can be used in RF detectors to measure RF voltage, according to the prior art. Circuit 400 is similar to circuit 200 however, in contrast, circuit 400 comprises one RF power supply V7, representing a power supply for a quadrupole; further, capacitor C9 is similar to capacitor C1, and diodes D4, D10 form a rectifying diode circuit. Resistors R10, R11 and capacitor C10 form a forward voltage averaging circuit, enabled to receive the forward rectified RF voltage from the rectifying diode circuit, such that an average of the forward rectified RF voltage can be measured across resistor R14. Resistors R20, R21 and capacitor C14 form a reverse voltage averaging circuit, enabled to receive the reverse rectified RF voltage from the rectifying diode circuit, such that an average of the reverse rectified RF voltage can be measured across resistor R14. The voltage drop voltage drop across diode D4 is similar to that of curve 300 when an RF voltage is applied, with similar problems associated with the reverse voltage bias drop.

The values of capacitors C9, C10, C14, and resistors R10, R11, R14, R20, R21, R22 can be any suitable value and can be determined via any suitable circuit modelling software. Furthermore, the values of capacitors C9, C10, C14, and resistors R10, R11, R14, R20, R21 can depend on the desired gain of circuit 400 and or/the degree of averaging desired. In specific non-limiting embodiments, capacitor C9 is on the order of a few pF, capacitors C10, C14 are each on the order of a few nF, resistors R10, R12 are each on the order of a few hundred ohms, resistors R11, R21 are each on the order of a kilo-ohm to tens of kilo-ohms, and resistors R14, R22 are each on the order of a few megaohms. Each of diodes D4, D10 can comprise any suitable diode. In specific non-limiting exemplary embodiments, each of diodes D4, D10 can comprise a Schottky diode D1N5711, however any suitable diode is within the scope of present embodiments.

Figure 5:
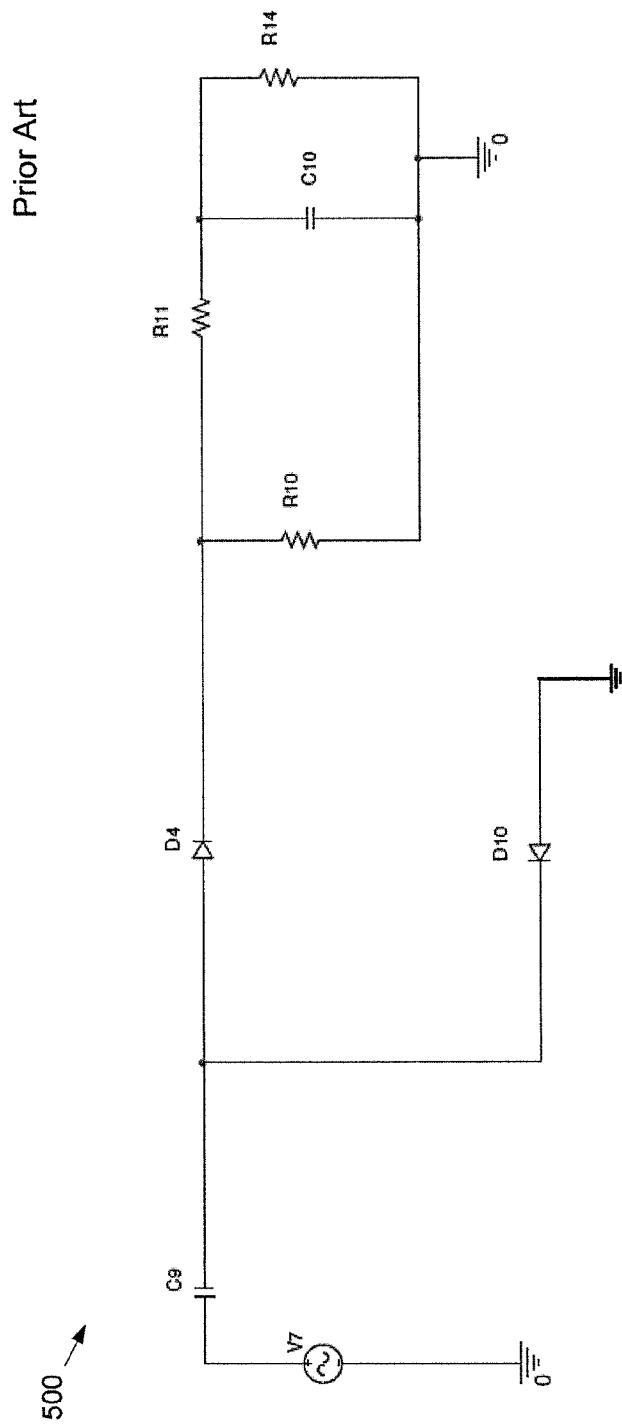

Attention is now directed to FIG. 5 which depicts a circuit 500 which can be used in RF detectors to measure RF voltage, according to the prior art. Circuit 500 is similar to circuit 400, with like elements having like numbers however, however, in contrast, circuit 400 comprises the forward voltage averaging circuit, formed from resistors R10, R11 and capacitor C10, such that an average of the forward rectified RF voltage can be measured across resistor R1. In comparison to circuit 400, however, circuit 500 is lacking a reverse average voltage averaging circuit, and reverse rectified voltage is simply sent to ground. Similar values of capacitances and resistances can be used as described above with reference to FIG. 4.

As described above circuits 200, 300, 400, 500 all suffer from a large reverse bias voltage drop across at least one of the diodes in each respective rectifying diode circuit, leading to instability in the diodes, mass drift in the quadrupole to which the RF voltage is being supplied and eventually breakdown of the diodes. Hence, apparatus 198 is enabled to reduce reverse leakage current from at least one diode in a diode rectifying circuit.

Figure 6:
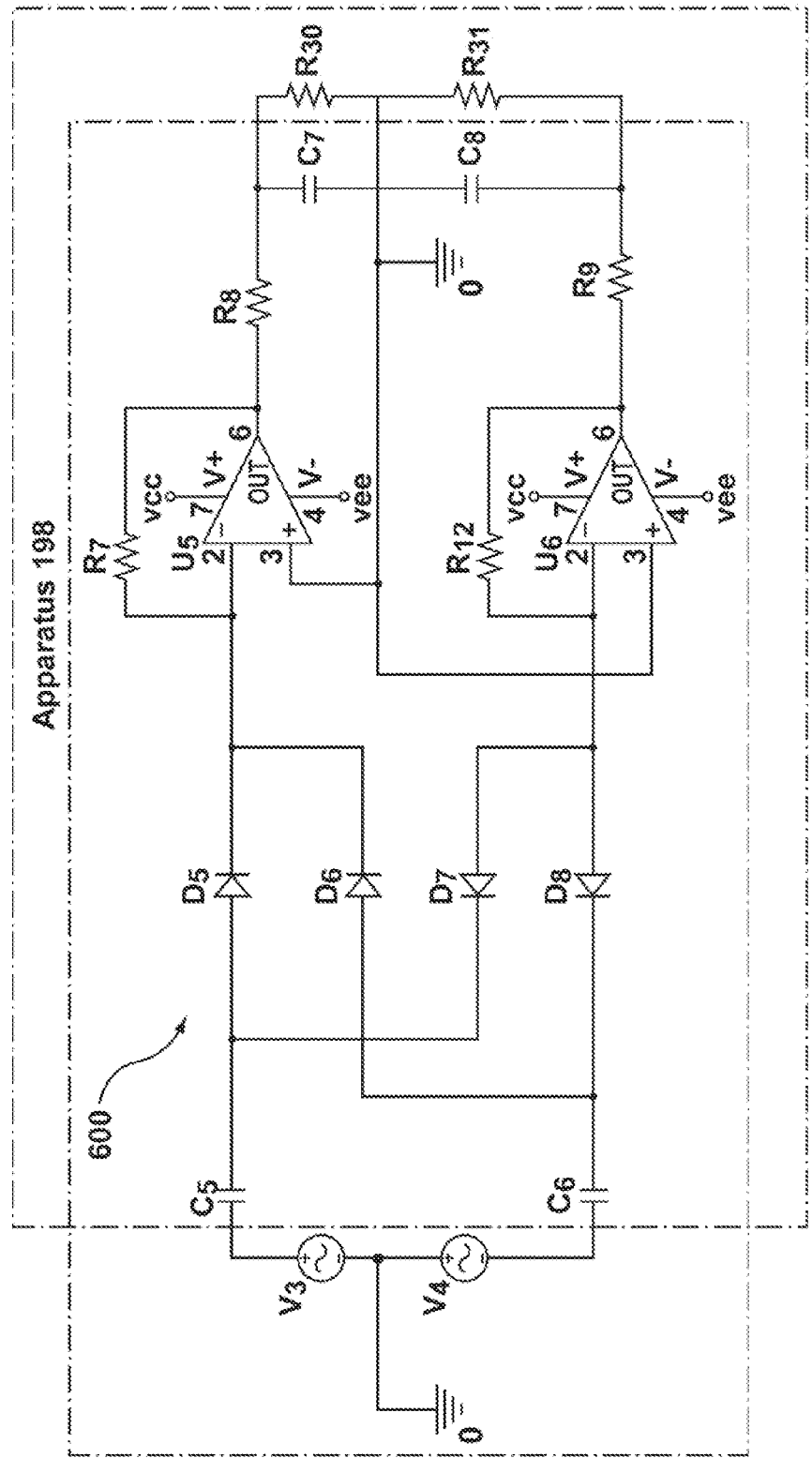
FIGS. 6 to 9 depict schematic diagrams of circuits for measuring RF voltage supplied to a quadrupole in a mass spectrometer, according to non-limiting embodiments.

For example, attention is directed to FIG. 6, which depicts non-limiting embodiments of apparatus 198 which comprise a circuit 600, connected to RF power supplies V3, V4, each representing an RF power supply for a pair of rods in a quadrupole. In general, circuit 600 is similar to circuit 200, and comprises a capacitors C5, C6, similar to capacitors C1, C2 respectively, and a rectifying diode circuit formed from diodes D5, D6, D7, D8, similar to the rectifying diode circuit formed from capacitors D1, D2, D3, D9, respectively, of circuits 200. In addition, circuit 600 comprises a first averaging circuit formed by resistor R8 and capacitor C7, such that average forward rectified RF voltage can be measured across resistor R30, and a second averaging circuit formed by resistor R9 and capacitor C8, such that average reverse rectified RF voltage can be measured across resistor R31.

Circuit 600 further comprises at least one operational amplifier U5, U6, configured as a current to voltage converter, a negative input of at least one operational amplifier U5, U6 connected to the output of at least one diode D5, D6, D7, D8 in the at least one rectifying diode circuit, a positive input of at least one operational amplifier U5, U6 at ground, and an output of at least one operational amplifier U5, U6 in a feedback loop with the negative input of at least one operational amplifier U5, U6, to reduce reverse leakage current from the at least one diode D5, D6, D7, D8.

For example, the negative input of operational amplifier U5 is connected to the output of diodes D5, D6, diode D5 connected to RF power supply V3 (via capacitor C5), and diode D6 connected to RF power supply V4 (via capacitor C6). Taking diode D5 as a non-limiting example, as the negative input of operational amplifier U5 is connected to the output of diode D5, and the positive input of operational amplifier U5 is grounded, operational amplifier U5 acts as an inverting amplifier. And, as the negative input of operational amplifier U5 is in a feedback loop with the output of operational amplifier U5, the negative input generally matches the positive input, and as the positive input is grounded, $V_-=V_+\approx0$ (where $V_-$ is the voltage at the negative input of operational amplifier U5, and $V_+$ is the voltage at the positive input of operational amplifier U5). Hence, operational amplifier U5 reduces any current from diode D5.

Hence, when a reverse bias voltage is applied to diode D5, such that the reverse bias voltage drop across diode D5 is large, and consequently so is the leakage current, operational amplifier U5 reduces the reverse voltage drop via the feedback loop. For example, FIG. 3 further depicts a curve 350 representing a modelled voltage drop across diode D5, for example, when an RF voltage is applied to diode D5 from RF power supply V3. It is understood that curves 300 and 350 are depicted as being 180° out of phase for clarity. Curve 350 comprises a plurality of positive sections, represented in part by section 351a, and a plurality of negative sections, represented in part by section 351b, alternating there between as an RF voltage is applied. In general, section 351a represents the reverse bias voltage drop across diode D1, for example, and section 351b represents the forward bias voltage drop across diode D1. It is understood from section 351a and section 351b that the reverse bias voltage drop is similar to the forward bias voltage drop due to the reduction leakage current by operational amplifier U5. Furthermore, from a comparison of curves 300 and 350, it is understood that the reverse bias voltage of diode D5 of circuit 500 has been decreased in comparison to the reverse bias voltage of diode D1 of circuit 200 due to the reduction of reverse bias leakage current provided by operational amplifier U5.

It is further understood that operational amplifier U5 plays a similar role in reducing reverse bias leakage current in diode D6. It is yet further understood that operational amplifier U6 plays a similar role in reducing reverse bias leakage current in diodes D7, D8.

Hence the large reverse bias voltage drop across at least one of diodes D5, D6, D7, D8 in each respective rectifying diode circuit, is reduced by the at least one operational amplifier U5, U6, which leads to better stability in diodes D5, D6, D7, D8, and hence reduces mass drift in the quadrupole to which the RF voltage is being supplied and lengthens the life of diodes D5, D6, D7, D8 as breakdown of diodes D5, D6, D7, D8 becomes less likely.

It is further understood that apparatus 198 can comprise any suitable number of connectors for connecting to RF power supplies V3, V4 and/or the associated quadrupole(s) to which RF voltage is being supplied. In some embodiments, apparatus 198 comprises any suitable number of connectors such that the voltage across resistor R30 and/or R31 can be measured. In some embodiments, apparatus 198 further comprises an output to apparatus 199 and/or processor 185 such that the measured voltage across resistor R30 and/or R31 can be fed into a feedback loop with apparatus 199 for controlling the RF voltage supplied to quadrupole 140 (and/or collision cell 150).

The values of capacitors C5, C6, C7, C8 and resistors R7, R8, R9, R12, R30, R31 can be any suitable value and can be determined via any suitable circuit modelling software. Furthermore, the values of capacitors C5, C6, C7, C8 and resistors R7, R8, R9, R12 can depend on the desired gain of circuit 600 and or/the degree of averaging desired. In specific non-limiting embodiments, capacitors C5, C6 are each on the order of a few pF, capacitors C7, C8 are each on the order of a few nF, resistors R7, R12 are each on the order of a few hundred ohms, resistors R8, R9 are each on the order of a kilo-ohm to tens of kilo-ohms, and resistors R30, R31 are each on the order of a few megaohms. Each of diodes D5, D6, D7, D8 can comprise any suitable diode. In specific non-limiting exemplary embodiments, each of diodes D5, D6, D7, D8 can comprise a Schottky diode D1N5711, however any suitable diode is within the scope of present embodiments. Each of operational amplifiers U5, U6 can comprise any suitable operational amplifier. In non-limiting exemplary embodiments, each of operational amplifiers can comprise a low noise operational amplifier LT1806, however any suitable operational amplifier is within the scope of present embodiments. It is further understood that each of operational amplifiers is connected to suitable power supplies and/or power supplies supplying suitable voltages Vee, Vcc.

Figure 7:
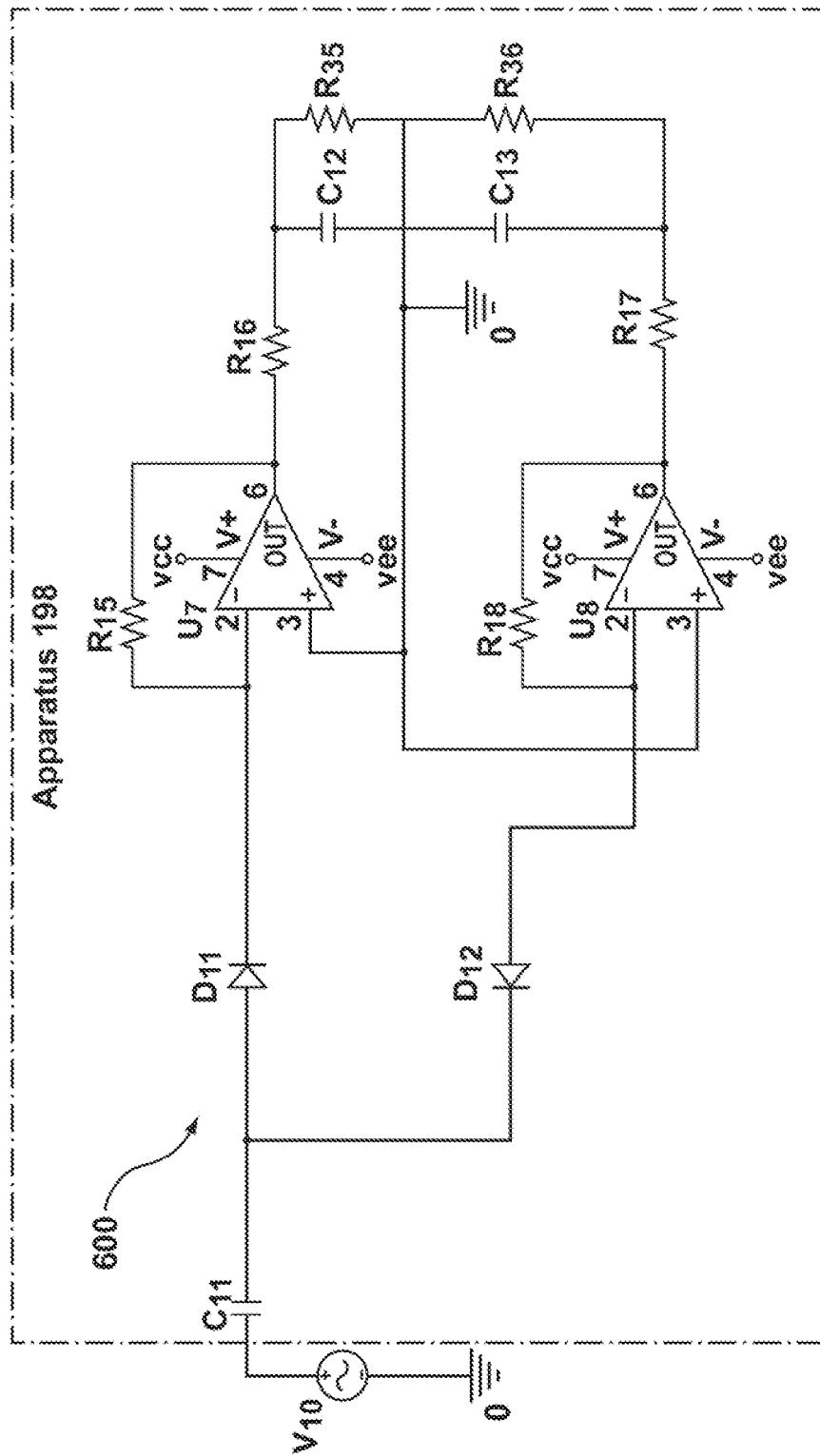

Attention is now directed to FIG. 7 which depicts alternative embodiments of apparatus 198 comprising a circuit 700. Circuit 700 is similar to circuit 400, and is enabled to measure average rectified voltage from a single RF power supply V10 and comprises a diode D11 analogous to diode D4, and a diode D12, analogous to diode D10, diodes D11, D12 forming a rectifying diode circuit. Circuit 700 further comprises averaging circuits, a first averaging circuit comprising resistor R16 and capacitor C12, such that an average forward bias voltage can be measured across resistor R35, and a second averaging circuit comprising resistor R17 and capacitor C13, such that an average forward bias voltage can be measured across resistor R36. However, circuit 700 includes an operational amplifier U7 for reducing the reverse bias current of diode D11, and an operational amplifier U8 for reducing the reverse bias current of diode D12, as described above. Similar values of capacitances and resistances, and similar diodes and operational amplifiers can be used as described above with reference to FIG. 6.

Figure 8:
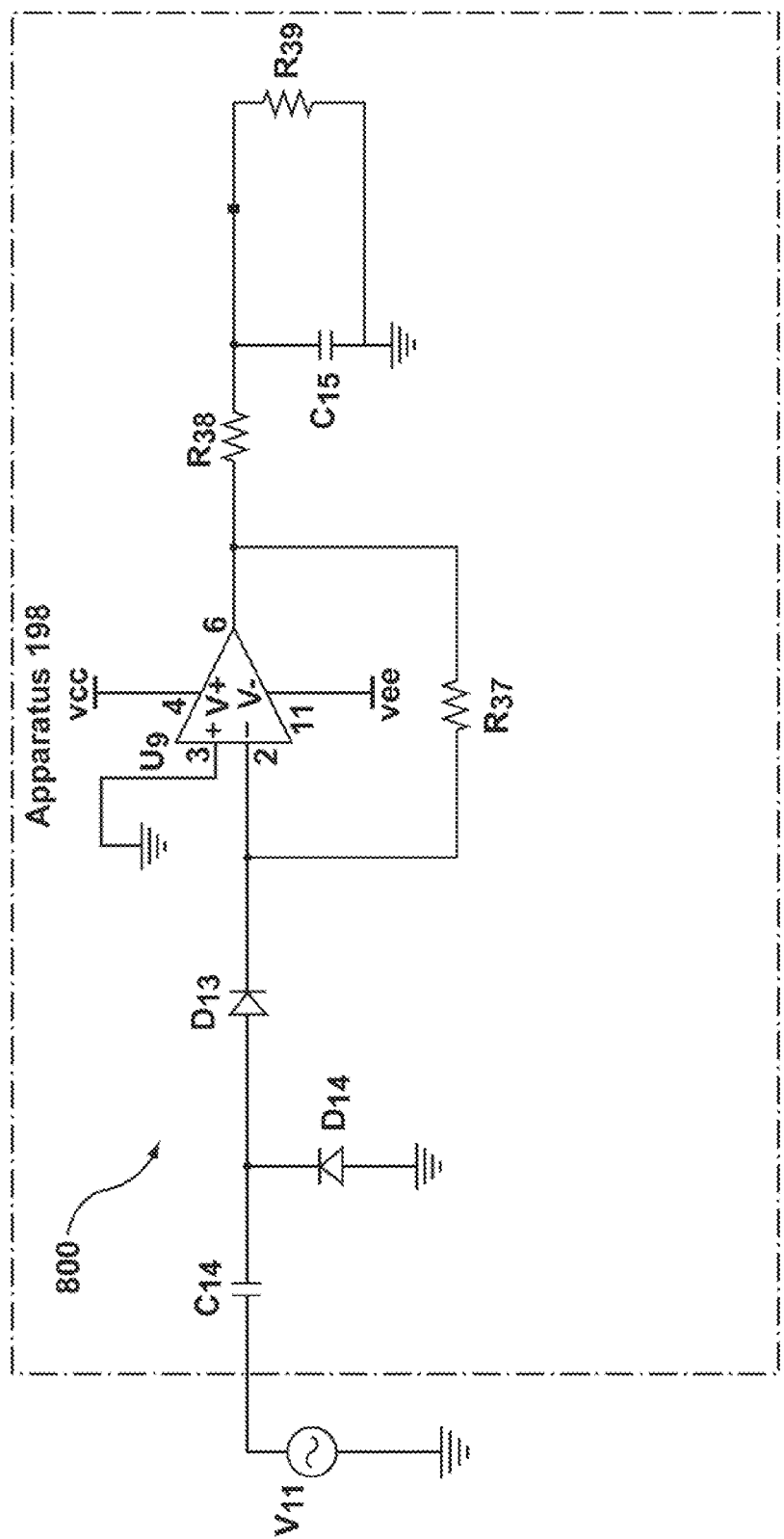

Attention is now directed to FIG. 8 which depicts alternative embodiments of apparatus 198 comprising a circuit 800. Circuit 800 is similar to circuit 500, and is enabled to measure average rectified voltage from a single RF power supply V11 and comprises a diode D13 analogous to diode D4, and a diode D14, analogous to diode D10, diodes D13, D14 forming a rectifying diode circuit. Circuit 800 further comprises an averaging circuit comprising resistor R38 and capacitor C15, such that an average forward bias voltage can be measured across resistor R39. Reverse bias voltage is passed to ground via diode D14. However, circuit 800 includes an operational amplifier U9 for reducing the reverse bias current of diode D13, as described above. Similar values of capacitances and resistances, and similar diodes and operational amplifiers can be used as described above with reference to FIG. 6.

Figure 9:
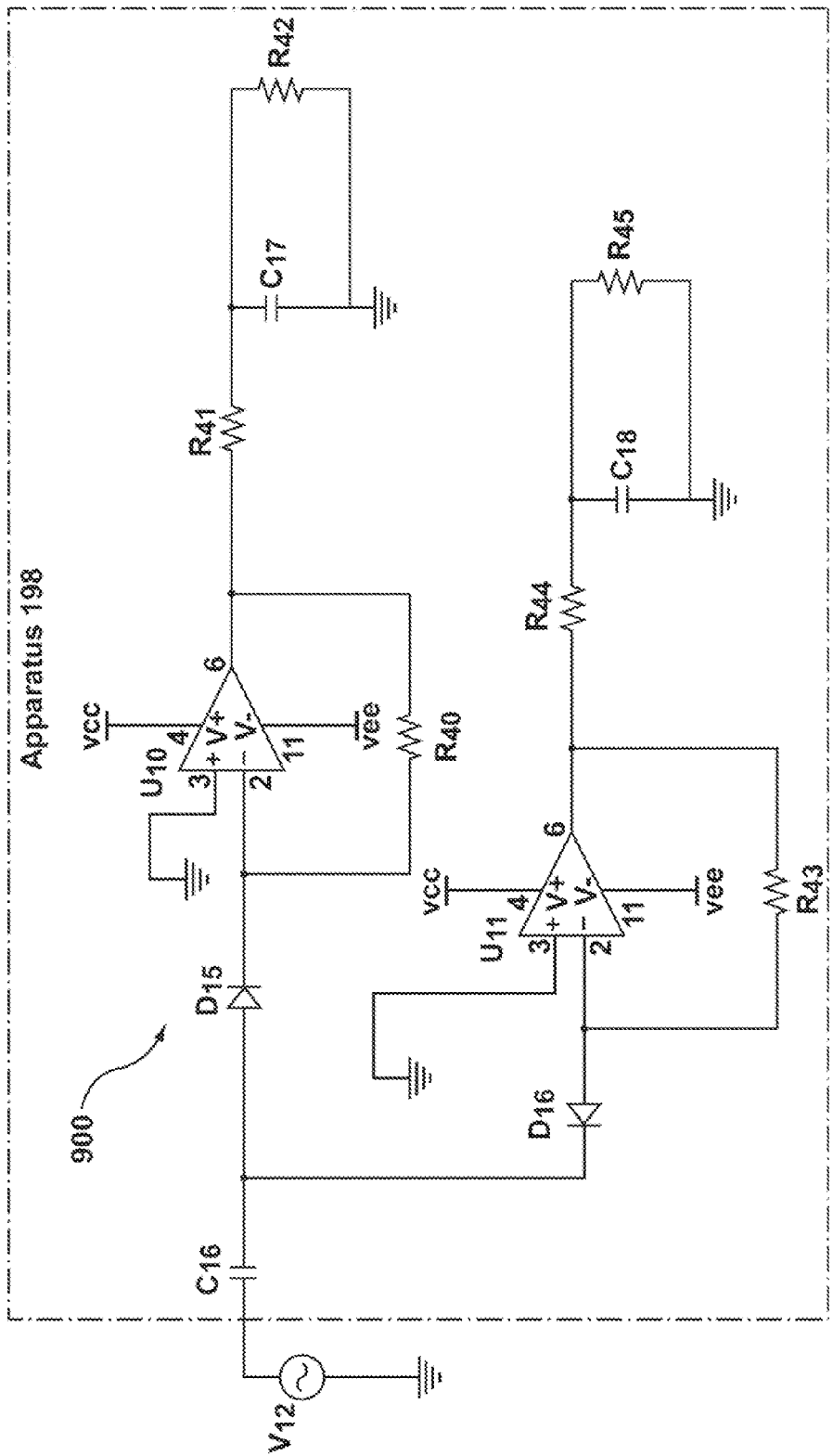

Attention is now directed to FIG. 9 which depicts alternative embodiments of apparatus 198 comprising a circuit 900. Circuit 800 is similar to circuit 900, and is enabled to measure average rectified voltage from a single RF power supply V12 and comprises a diode D15 analogous to diode D13, and a diode D16, analogous to diode D14, diodes D15, D16 forming a rectifying diode circuit. Circuit 900 further comprises a first averaging circuit comprising resistor R41 and capacitor C17, such that an average forward bias voltage can be measured across resistor R42. Circuit 900 further comprises s second averaging circuit comprising resistor R44 and capacitor C18, such that an average reverse bias voltage can be measured across resistor R45. Operational amplifier U10 is analogous to operational amplifier U9, for reducing reverse leakage current from diode D15. However, circuit 900 further comprises an operational amplifier U1 for reducing the reverse bias current of diode D16, in measurements of average reverse rectified RF voltage. Similar values of capacitances and resistances, and similar diodes and operational amplifiers can be used as described above with reference to FIG. 6.

It is further understood that apparatus 198 and/or circuit 600 and/or circuit 700 and/or circuit 800 and/or circuit 900 can be provided in a method for measuring RF voltage supplied to a quadrupole from at least one RF power supply.

Those skilled in the art will appreciate that in some embodiments, the functionality of mass spectrometer 100 can be implemented using pre-programmed hardware or firmware elements (e.g., application specific integrated circuits (ASICs), electrically erasable programmable read-only memories (EEPROMs), etc.), or other related components. In other embodiments, the functionality of mass spectrometer 100 can be achieved using a computing apparatus that has access to a code memory (not shown) which stores computer-readable program code for operation of the computing apparatus. The computer-readable program code could be stored on a computer readable storage medium which is fixed, tangible and readable directly by these components, (e.g., removable diskette, CD-ROM, ROM, fixed disk, USB drive). Alternatively, the computer-readable program code could be stored remotely but transmittable to these components via a modem or other interface device connected, to a network (including, without limitation, the Internet) over a transmission medium. The transmission medium can be either a non-wireless medium (e.g., optical and/or digital and/or analog communications lines) or a wireless medium (e.g., microwave, infrared, free-space optical or other transmission schemes) or a combination thereof.

Persons skilled in the art will appreciate that there are yet more alternative implementations and modifications possible for implementing the embodiments, and that the above implementations and examples are only illustrations of one or more embodiments. The scope, therefore, is only to be limited by the claims appended hereto.

What is claimed is:

1. An apparatus for measuring a sinusoidal RF voltage from a quadrupole in a mass spectrometer, comprising:
at least one rectifying diode circuit for rectifying said RF voltage of said quadrupole to produce and measure a rectified RF voltage by providing an average of the rectified RF voltage;
at least one operational amplifier configured as a current to voltage converter, a negative input of said at least one operational amplifier connected to the output of at least one diode in said at least one rectifying diode circuit, a positive input of said at least one operational amplifier at ground, and an output of said at least one operational amplifier in a feedback loop with said negative input, to continuously convert the diode current to a voltage and to reduce reverse leakage current across the at least one diode;
a second diode in the at least one rectifying circuit, the second diode connected in opposite polarity to the at least one diode; and
the at least one and the second diodes connected to the at least one operational amplifier.

2. The apparatus of claim 1, further comprising at least one capacitor, of a given capacitance, for isolating said quadrupole from said at least one rectifying diode circuit such that said RF voltage is reduced by a given amount.

3. The apparatus of claim 1, further comprising an RC filter, following said at least one operational amplifier, for providing an average of said rectified RF voltage.

4. The apparatus of claim 1, wherein said at least one rectifying diode circuit is enabled to rectify RF voltage of one RF power supply, said RF power supply for supplying RF voltage to said quadrupole.

5. The apparatus of claim 1, wherein said at least one rectifying diode circuit is enabled to rectify RF voltage of at least two RF power supplies, said RF power supplies for supplying RF voltage to at least one quadrupole, including said quadrupole.

6. The apparatus of claim 1, further comprising at least one connector for connection to at least one of: said quadrupole; and at least one RF power supply for supplying said RF voltage to said quadrupole.

7. The apparatus of claim 1, further comprising at least one connector for connection to a feedback loop for controlling an RF power supply for supplying said RF voltage to said quadrupole, said at least one connector in communication with an output of said operational amplifier such that a measured rectified RF voltage can be determined.

8. A method for measuring sinusoidal RF voltage from a quadrupole in a mass spectrometer, comprising:
providing a circuit comprising:
at least one rectifying diode circuit for rectifying said RF voltage of said quadrupole to produce and measure a rectified RF voltage by providing an average of the rectified RF voltage;
at least one operational amplifier configured as a current to voltage converter, a negative input of said at least one operational amplifier connected to the output of at least one diode in said at least one rectifying diode circuit, a positive input of said at least one operational amplifier at ground, and an output of said at least one operational amplifier in a feedback loop with said negative input, to continuously convert the diode current to a voltage and to reduce reverse leakage current across the at least one diode;
a second diode in the at least one rectifying circuit, the second diode connected in opposite polarity to the at least one diode;
the at least one and the second diodes connected to the at least one operational amplifier; and
measuring said RF voltage via said circuit.

9. The method of claim 8, wherein said circuit further comprises at least one capacitor, of a given capacitance, for isolating said quadrupole from said at least one rectifying diode circuit such that said RF voltage is reduced by a given amount.

10. The method of claim 8, wherein said circuit further comprises an RC filter, following said at least one operational amplifier, for providing an average of said rectified RF voltage.

11. The method of claim 8, wherein said at least one rectifying diode circuit is enabled to rectify RF voltage of one RF power supply, said RF power supply for supplying RF voltage to said quadrupole.

12. The method of claim 8, wherein said at least one rectifying diode circuit is enabled to rectify RF voltage of at least two RF power supplies, said RF power supplies for supplying RF voltage to at least one quadrupole, including said quadrupole.

13. The method of claim 8, wherein said circuit further comprises at least one connector for connection to at least one of: said quadrupole; and at least one RF power supply for supplying said RF voltage to said quadrupole.

14. The method of claim 8, wherein said circuit further comprises at least one connector for connection said circuit to a feedback loop for controlling an RF power supply for supplying said RF voltage to said quadrupole, said at least one connector in communication with an output of said operational amplifier such that a measured rectified RF voltage can be determined.

* * * * *